Oct. 24, 1967 C. R. CROWELL ETAL 3,349,297

SURFACE BARRIER SEMICONDUCTOR TRANSLATING DEVICE

Filed June 23, 1964 2 Sheets-Sheet 1

INVENTORS C. R. CROWELL
S. M. SZE
BY H. W. Lockhart
ATTORNEY

United States Patent Office 3,349,297

Patented Oct. 24, 1967

3,349,297

SURFACE BARRIER SEMICONDUCTOR TRANSLATING DEVICE

Clarence R. Crowell, Scotch Plains, and Simon M. Sze, Summit, N.J., assignors to Bell Telephone Laboratories, Incorporated, New York, N.Y., a corporation of New York Filed June 23, 1964, Ser. No. 377,266
8 Claims. (Cl. 317—234)

Figure 1:
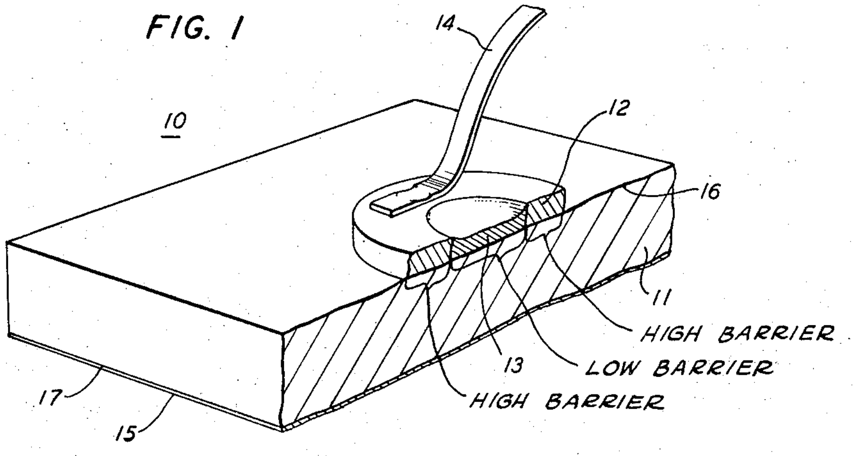

This invention relates to semiconductor signal translating devices having at least one rectifying junction of the surface barrier or Schottky type comprising a metal-to-semiconductor interface.

The need for microscopic dimensions in semiconductor signal translating devices, particularly those adapted for use at high frequencies is well known. Moreover, in semiconductor devices of the surface barrier type, it is particularly important to control precisely the area and shape of the surface barrier electrode, inasmuch as the rectifying junction area is determined by the metal-to-semiconductor interface. Moreover, it is difficult to attach external connections to the surface barrier electrodes because of their small size, and, in the case of the metal base transistor as disclosed in United States Patent 3,121,809 to M. M. Atalla, because of the location of the metal layer intermediate the semiconductor regions.

In accordance with this invention, a semiconductor device including a Schottky or surface barrier electrode comprises at least two metals having differing potential barrier heights in relation to the semiconductor material. As is known, for most metal-to-semiconductor contact combinations there is a characteristic potential energy barrier customarily expressed in terms of electron volts with respect to the Fermi energy level. In one aspect, this barrier height is a measure of the reverse saturation current across the particular metal-to-semiconductor interface.

Thus, one device in accordance with this invention comprises at least two metals in separate layers conjoined, that is, touching or overlapping, on a surface of a body of semiconductor material. The two metals are selected for their differing barrier heights in relation to the semiconductor material. The layer of the first or higher barrier metal is generally greater in area and may serve both to define in part, or completely, the extent of the second lower barrier metal which constitutes the effective surface barrier contact, and to provide facile means for making external connection thereto. The thickness of this first metallic layer is made many molecular layers thick, typically about 500 A. Because of the difference in barrier heights of the two metals conduction across the metal-semiconductor interface will concentrate in the portion having the lower barrier height. More specifically, the higher barrier metal layer may function as a fabrication mask to define the shape and area of the barrier electrode. If the barrier electrode is one of the light, active metals such as calcium, the more extensive high barrier layer completely overlies the barrier electrode and thus seals it from corrosive activity.

Thus, a primary object of the invention is improved semiconductor devices of the Schottky barrier type.

A further object of the invention is more facile techniques for fabricating devices which include surface barriers.

One feature of the invention is a transistor structure utilizing the two-metal arrangement for making the base or intermediate layer and contact thereto in accordance with this invention.

Figure 2:
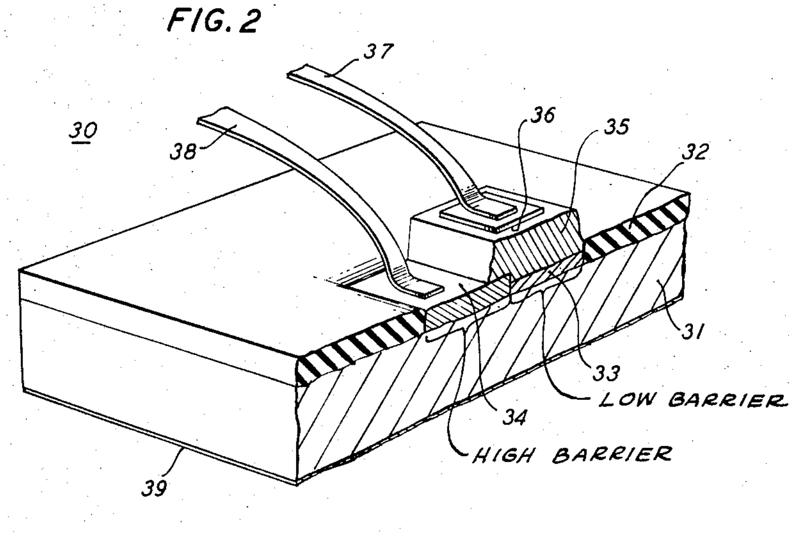
Figure 3:
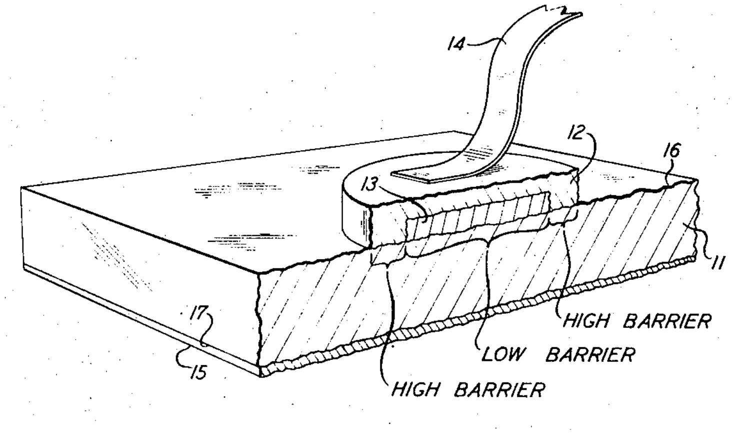

The invention and its other objects and features will be better understood from a consideration of the following more detailed description taken in conjunction with the drawing in which:

FIG. 1 is a perspective view partially in section of a semiconductor surface barrier diode in accordance with the invention;

FIG. 2 similarly is a perspective view partially in section of a transistor of the metal base or hot electron type illustrating the principles of this invention; and FIG. 3 is a perspective view partially in section of an alternate embodiment of a semiconductor surface barrier diode in accordance with the invention.

One form of the invention is shown in the semiconductor diode of FIG. 1. In particular, the device 10 comprises a wafer 11 of single crystal silicon semiconductor material. On a portion of the surface 16 of the wafer 11 there is a layer 12 of a first metal, specifically platinum, having a small central opening to the surface 16. Customarily, at least a portion of the platinum layer is converted to platinum silicide by heat treatment in order to improve the adherence of this layer. However, the electrical properties remain essentially the same. Within the small central portion, which typically is less than one mil in diameter, is a layer 13 of a second metal, specifically tungsten, which comprises the surface barrier electrode and which makes rectifying contact to the surface 16 of the silicon wafer 11.

External electrical connection is made to the rectifying electrode of the diode conveniently by means of the thermocompression bonded or soldered metal lead 14 attached conveniently to a portion of the platinum layer 12. The second terminal of the diode comprises the substantially ohmic contact produced by the metal plating 15 applied to the opposite surface 17 of the silicon wafer 11. The technique for making such plated ohmic contacts is well known in the art.

The effective surface barrier or Schottky electrode is defined by the area of the tungsten layer 13 in contact with the silicon wafer 11. The platinum layer 12 surrounding the tungsten electrode 13 serves both to define the limited extent of the effective barrier electrode 13 and also to provide a convenient means for making electrical contact to the surface barrier electrode. Inasmuch as the platinum to silicon barrier height is greater than the barrier height of the tungsten to silicon, conduction beween the semiconductor and metal contact tends to concentrate almost entirely through the tungsten electrode. Thus the platinum effectively functions as a mask to define the limited area of the surface barrier electrode 13 and further provides facile means for making connection to such electrode.

One advantageous technique for making the diode depicted in FIG. 1 comprises preparing a wafer of single crystal silicon of N-type conductivity having a resistivity in the range from 0.05 to 50 ohms-cm. As is well known, the particular value of starting resistivity is chosen primarily on the basis of the final device characteristics desired, particularly, in this case, by the current density to be handled by the device. Moreover, although the fabrication is described in terms of a single wafer of about twenty mils square, a plurality of identical devices conveniently may be fabricated on a larger slice of silicon semiconductor material which subsequently is divided into the individual wafers comprising the separate devices. Also, if desired, one may produce a layer of epitaxially deposited silicon on the surface of the slice in order to provide material of a particular purity or conductivity value or impurity profile. The underlying substrate may be of very low resistivity material for conveniently making ohmic connection to the device. These procedures are techniques well known in the art and are not particularly within the scope of this invention.

In accordance with one technique for fabricating the device 10 of FIG. 1, the surface 16 of the wafer 11 is carefully polished and cleaned. An oxide layer then is formed on the surface by any one of several alternative means well known in the art such as thermal growth or evaporation deposition. The oxide coating then is removed from a ring-shaped area corresponding to the locus of the platinum layer 12 in the completed device. This selective removal is done by photo-resist masking and etching as disclosed, for example, in United States Patent 3,122,817 of J. Andrus.

The layer 12 of platinum next is deposited by cathode sputtering as disclosed in the application of M. P. Lepselter, Ser. No. 331,168, filed Dec. 17, 1963, now United States Patent 3,287,612, and assigned to the same assignee of this application. Advantageously, the thickness of the platinum layer is about 500 angstroms. A short heat tratment at about 500 degrees centigrade serves to sinter the platinum to the silicon except on the oxide-coated portions.

The silicon wafer then is etched in hot aqua regia which removes the unsintered platinum coating where it overlies the oxide, leaving a ring of sintered platinum or platinum silicide adhering to the silicon substrate. The platinum and oxide-coated surface is remasked using photoresist to cover the oxide coating on the surface outside of the platinum ring. This mask may overlap on the platinum ring without affecting the next etching step. The element then is etched using hydrofluoric acid to remove only the silicon oxide within the center of the platinum ring which is not attacked by the etchant.

Next, the tungsten layer 13 grown in the exposed central portion within the ring of platinum 12. This is done by mounting the wafer in a nickel reaction tube heated by a furnace to a temperature of about 370 degrees centigrade. Next, tungsten hexafluoride suspended in vapor form in purified argon carrier gas is metered through the reaction tube. The tungsten hexafluoride reacts with the silicon at the elevated temperature and a tungsten film is grown on the unmasked portion of the silicon wafer. In one instance the wafer was exposed to the tungsten hexafluoride stream for about two minutes. After cooling to room temperature a tungsten film of approximately 200 angstroms thickness was produced on the unmasked portion of silicon.

In connection with the foregoing tungsten deposition process, it is important to purify the carrier gas, for example, by passing it through a column of titanium metal turnings at a temperature of 800 degrees centigrade. A measured amount of liquid tungsten hexafluoride is injected into the stream of purified argon where it vaporizes. The mixture then passes through a sodium fluoride adsorption seal to remove traces of hydrogen fluoride and then passes into the reaction tube. Generally, inasmuch as the deposition proceeds from a reaction between the silicon surface and the tungsten compound, the growth occurs only on the silicon.

After deposition of the tungsten electrode the device is in suitable form for attachment of a wire connector 14 which may be bonded or otherwise attached at any convenient point on the platinum coating. As mentioned hereinbefore, the ohmic plated contact 15 on the opposite surface 17 may be formed by any one of several techniques well known in the art. For example, a method of applying the nickel plated contact is disclosed in Patent 2,793,420 to R. L. Johnston and R. L. Rulison.

The foregoing described method of growing tungsten may be used also with germanium and gallium arsenide. Etching of a tungsten electrode or germanium and silicon may be done using a mixture of hydrofluoric and nitric acid. In the case of gallium arsenide, a tungsten electrode may be chemically etched to size with a mixture of sulfuric acid and hydrogen peroxide.

In the structure depicted in FIG. 1, the platinum layer 12 comprising the first metal serves, as noted above, to define the area of the second metal 13, in this case tungsten, and further to provide a convenient means for making external connection to the contact.

In another embodiment of the invention depicted in FIG. 3, certain of the so-called active metals such as calcium, sodium, lithium or magnesium may be used to make an ohmic contact to N-type conductivity silicon. For such an application the active metal such as calcium may be deposited by evaporation deposition through an orifice in a mask followed immediately by similar vapor deposition of a metal such as platinum or gold so that the second deposited metal completely covers and surrounds the active metal layer. Thus the relatively readily corroded active metal which makes a substantially ohmic barrier contact to the silicon is protectively sealed from the surrounding ambient. The structure depicted in FIG. 3 is similar to that of FIG. 1, except for the complete covering of layer 12 (platinum or gold) over layer 13 ("active" metal) in FIG. 3. In FIGS. 1 and 3, consequently, the same reference numerals appear.

In connection with the foregoing devices, the extent of the first metal layer 12 may be reduced, if desired, prior to the attachment of the external connection 14 by standard masking and etching techniques, for example by depositing a gold plating over the portion to be retained and removing the remainder of the metal plating by the back-sputtering technique as disclosed, for example, in the application of M. P. Lepselter, Ser. No. 347,173 filed Feb. 25, 1964, now United States Patent 3,271,286 and assigned to the same assignee of this application. In addition to the aforementioned metals, suitable alternatives to tungsten and molybdenum for the surface barrier electrode are the metals silver and copper. Alternatives to platinum as the first metal layer are gold and vanadium. Following in tabular form are the approximate barrier heights in electron volts of these metals to silicon of both P and N-type conductivity:

*N-type silicon*

| | Electron volts |
|---|---|
| Gold | .80 |
| Platinum | .85 |
| Vanadium | .82 |
| Tungsten | .65 |
| Silver | .67 |
| Copper | .55 |
| Molybdenum | .65 |

*P-type silicon*

| | Electron volts |
|---|---|
| Gold | .32 |
| Platinum | .27 |
| Vanadium | .30 |
| Tungsten | .47 |
| Silver | .45 |
| Copper | .57 |
| Molybdenum | .45 |

It will be noted that the foregoing specific embodiments were given in terms of the use of N-type conductivity silicon. For P-type conductivity silicon it will be seen that the potential differences are reversed in sign and, accordingly, the order of the metals in a particular device structure is reversed. For example, if the diode 10 of FIG. 1 is fabricated using P-type silicon, the surface barrier electrode 13 may be of platinum and the first metal layer 12 is of tungsten. The significant aspect of the invention which is observed in all of the suggested structural arrangements is the relative difference in barrier height of the two metals employed.

The invention also may be applied advantageously to a transistor of the so-called hot electron type, as disclosed in United States Patent 3,121,809 to M. M. Atalla. Hot electron transistors comprise a three-region, three electrode semiconductor signal translating device in which the intermediate or base region is a very thin metal layer which forms a Schottky type barrier with emitter and collector regions of conventional semiconductor material. One exemplary structure of this type utilizing the principles of this invention is shown in FIG. 2.

The device of FIG. 2 comprises a substrate 31 of semiconductor material, for example, silicon of N-type conductivity having a resistivity of one ohm-cm. In accordance with the technique described above in connection with the fabrication of the device shown in FIG. 1, on one surface of this semiconductor, a protective coating of silicon oxide 32 is formed and a central opening made therein, using conventional photoresist and etching techniques. The intermediate or base region 33 of the device is a thin layer of tungsten produced as described above in connection with the device of FIG. 1. Adjoining the tungsten base layer 33 is a layer 34 of platinum which may partially surround the tungsten layer 33 so as to enable facile external connection to the base layer 33. Again, as in the case of the diode described above, the active barrier layer is defined by the tungsten to silicon interface which forms a collector junction. On top of the layers of tungsten 33 and platinum 34 is a layer 35 of N-type conductivity silicon produced by any one of the well-known techniques of vapor deposition, epitaxial deposition or cathode sputtering. Typically, this silicon layer is deposited over the entire surface and is then reduced to the mesa configuration shown in FIG. 2 by masking and etching in accordance with conventional transistor fabrication techniques. Specifically, the portion of the surface of the layer 35 to be retained may be defined by a coating of an etch-resistant material after which the surface is treated with the standard nitric acid-hydrofluoric acid which removes not only the silicon but portions of the underlying tungsten layer 33 so as to define one boundary of the base layer. This etchant does not attack the platinum layer 34. The silicon layer 35 constitutes the emitter region of the transistor and is in surface barrier contact with the tungsten base region 33. A plated metal electrode 36 enables external connection to be made to the emitter region 35. External connections to both the emitter and base regions may be made by conventional thermo-compression bonded leads 37 and 38, respectively, as illustrated. Ohmic contact is made to the original silicon substrate which comprises the collector region 31 by a plated contact 39 to the bottom face of the device in similar fashion to that described in connection with the diode structure above.

In connection with the transistor structure illustrated in FIG. 2, the increased capacitance of the base contact occasioned by the deposited platinum layer may be reduced to some extent by treating the immediately underlying semiconductor material to decrease its conductivity.

Although the invention has been described in terms of certain specific embodiments, it will be understood that other arrangements may be devised by those skilled in the art which likewise will fall within the scope and spirit of the invention.

What is claimed is:

1. A semiconductor signal translating device comprising a body of semiconductor material;

a first metal layer of many molecular layers' thickness plated on at least a portion of the surface of said body, and forming a surface barrier with said body;

a surface barrier electrode comprising a second metal layer plated on another portion of said surface, forming a surface barrier with said body, and making direct contact with said first metal layer, said second metal selected from the class of metals characterized by the property of having a barrier height in relation to said semiconductor lower than that of said first metal;

a metal lead attached to said first metal layer for making external electrical connection to said surface barrier electrode and a separate substantially ohmic connection to another portion of said body of semiconductor material.

2. A semiconductor signal translating device in accordance with claim 1 in which said first metal layer completely overlies said second metal layer.

3. A semiconductor signal translating device in accordance with claim 1 in which the first metal layer is essentially of material selected from the group consisting of gold, vanadium and platinum; the second metal layer is essentially of material selected from the group consisting of molybdenum, copper, silver and tungsten; and the body of semiconductor material is essentially n-type conductivity silicon.

4. A semiconductor signal translating device in accordance with claim 1 in which the second metal layer is essentially of material selected from the group consisting of platinum, gold and vanadium; the first metal layer is essentially of material selected from the group consisting of molybdenum, tungsten, copper and silver; and the body of semiconductor material is essentially p-type conductivity silicon.

5. A semiconductor signal translating device in accordance with claim 2 in which the first metal layer is essentially of material selected from the group consisting of gold and platinum; the second metal layer is essentially of material selected from the group consisting of calcium, sodium, lithium and magnesium; and the body of semiconductor material is essentialy n-type conductivity silicon.

6. A semiconductor signal translating device comprising a pair of regions of one conductivity type semiconductor material;

an intervening metallic layer separating said pair of regions, a portion of said intervening metallic layer consisting essentially of a first metal layer of many molecular layers' thickness and another portion of said intervening metallic layer consisting essentially of a second metal layer in direct contact with said first metal layer, said second metal selected from the class of metals characterized by the property of having a lower barrier height in relation to the semiconductor than that of said first metal, at least a portion of said first metal layer having an exposed surface, each of the metal layers plated on a portion of the surfaces of both said regions of the semiconductor, and each of the metal layers forming surface barriers with both said regions of the semiconductor;

an external electrical connection to said exposed surface of the first metal layers; and substantially ohmic contacts to each of said pair of semiconductor regions.

7. A semiconductor signal translating device in accordance with claim 6 in which the first metal layer is selected from the group consisting of platinum, gold and vanadium; the second metal layer is selected from the group consisting of tungsten, molybdenum, copper and silver; and the semiconductor material is essentially n-type conductivity silicon.

8. A semiconductor signal translating device in accordance with claim 6 in which said regions of semiconductor material are made of different semiconductor materials.

References Cited

UNITED STATES PATENTS

| | | | |
|---|---|---|---|
| 2,960,659 | 1/1960 | Burton | 330—65 |
| 3,200,310 | 8/1965 | Carman | 317—234 |
| 3,200,468 | 8/1965 | Dahlberg | 29—25.3 |
| 3,204,158 | 8/1965 | Shreiner | 317—234 |
| 3,223,902 | 12/1965 | Wright | 317—234 |
| 3,250,966 | 5/1966 | Rose | 317—235 |
| 3,280,391 | 10/1966 | Bittmann | 317—234 |

JOHN W. HUCKERT, *Primary Examiner.*

M. EDLOW, *Assistant Examiner.*